April 27, 1965 J. J. COTTER 3,181,043

SHOCK RESISTANT SEMICONDUCTOR DEVICE

Filed Feb. 25, 1960

INVENTOR.
JAMES J. COTTER

BY Elmer J. Nealon

ATTORNEY

United States Patent Office 3,181,043 Patented Apr. 27, 1965

3,181,043
SHOCK RESISTANT SEMICONDUCTOR DEVICE

James J. Cotter, Lynn, Mass., assignor to Sylvania Electric Products Inc., a corporation of Delaware Filed Feb. 25, 1960, Ser. No. 10,995
1 Claim. (Cl. 317—235)

Figure 2:
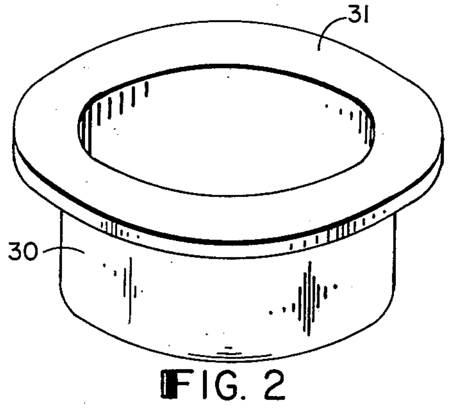

This invention relates to electrical translating devices and more particularly to shock resistant encapsulated semiconductor devices and methods for producing such devices.

Semiconductor electrical translating devices must be able to withstand the forces of severe mechanical shock when employed in certain applications. Since the electrically active elements of many types of semiconductor devices as well as their supporting structure and electrical connections are extremely susceptible to damage by shock, it is a common practice to embed or pot the active elements in an encapsulating material. The encapsulating material is cured or hardened to form a solid mass of material with the objective of holding the parts rigidly within the device envelope and preventing movement of the various parts with respect to each other. Several well known forms of containers or housings for semiconductor devices include a base section or stem having leads extending therethrough to which the active elements are connected and a cover section for enclosing the active elements. The uncured encapsulating or potting material is placed in the cover section, the cover and base sections are sealed together, and then the encapsulating material is solidified.

In the production of devices in this manner, however, it commonly occurs that sufficient encapsulating material to fill all the space within the chamber formed by the two sections of the container is not placed within the container. This deficiency occurs because it is a practical impossibility to meter the precise volume of material into each device. Placing an excess amount of material in the cover does not offer a solution to the problem because the material is incompressible and a portion of it would be extruded out of the chamber and onto the edges of the container thus preventing a satisfactory seal from being made between the two parts of the container. The introduction of encapsulating material to the chamber after the two sections of the container have been sealed entails added complications including another sealing operation. When insufficient encapsulating material is placed in the device, a void or voids containing the gases present at the time of sealing are necessarily present within the chamber. Under the force of shocks applied along certain directions, the solidified encapsulating material having the active elements embedded therein may overcome the frictional forces with the inner walls of the container and the restraints offered by the supporting structure and electrical connections for the active elements and move toward the empty regions of the chamber thus destroying the device. Since the encapsulating material as applied is generally in a viscous state small spaces or voids frequently form adjacent portions of the active elements, their supporting structure, or their electrical connections. Any element or portion thereof within the container which is not completely surrounded and supported by the potting material is very liable to fracture under severe mechanical shock.

Therefore, it is an object of the present invention to provide an improved shock resistant semiconductor electrical translating device.

It is also an object of the invention to provide an improved method of producing shock resistant semiconductor electrical translating devices.

It is a more specific object of the invention to provide a method of producing semiconductor electrical translating devices in which a compact, homogeneous mass of encapsulating material containing no voids is formed about the active elements, their supporting structure, and electrical connections to form a rigid immovable assembly within the container.

Briefly, in fulfilling the objects of the invention the electrically active elements of a semiconductor device are sealed together with a quantity of encapsulating material in a container or housing having a base section on which the active elements are mounted and a cover section which is adapted for sealing to the base section to provide a closed chamber about the active elements and encapsulating material. The quantity of encapsulating material is placed in one of the sections of the container prior to assembly, the two sections are placed together and sealed. The sealed device is then subjected to an accelerating force acting in a direction to accumulate the encapsulating material in a compact homogeneous mass, free of voids, and in contact with every point on the surfaces of the active elements, their supporting structure, and their electrical connections. The force is applied by centrifuging the device, desirably while it is oriented with the base section facing away from the axis of rotation of the centrifuge employed. This action causes all voids within the container to form in one region of the chamber spaced from the active elements. The encapsulating material is solidified while still in the region of the chamber to which it has been forced in order to provide a rigid, homogeneous mass of encapsulating material in which the active elements are firmly embedded. The configuration of the chamber is such that the solid mass of encapsulating material is positively restrained from any movement toward the region occupied by the voids. More particularly, the envelope includes a portion extending inwardly of the chamber with respect to adjacent regions of the envelope so that the inner surface of the wall of the envelope at the portion functions as a mold surface during the centrifuging operation and subsequent solidification of the encapsulating material thus forming a complementary surface on the mass of encapsulating material. In the completed device, the inner surface of the wall at the area of irregularity represented by the inward extension of the wall and the complementary impression in the mass of encapsulating material serve in the nature of a keying arrangement to prevent relative movement of the envelope and mass of encapsulating material.

Figure 1:
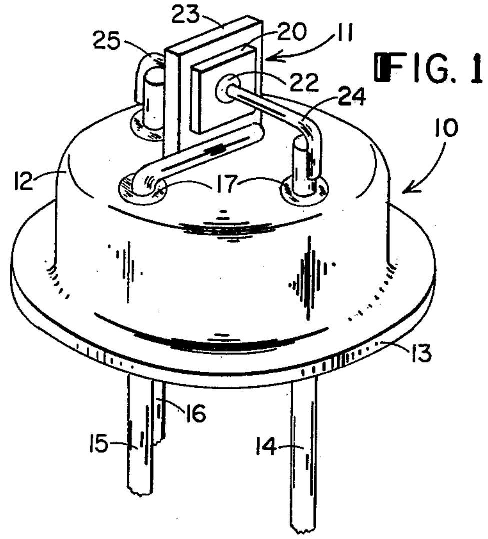
Figure 3:
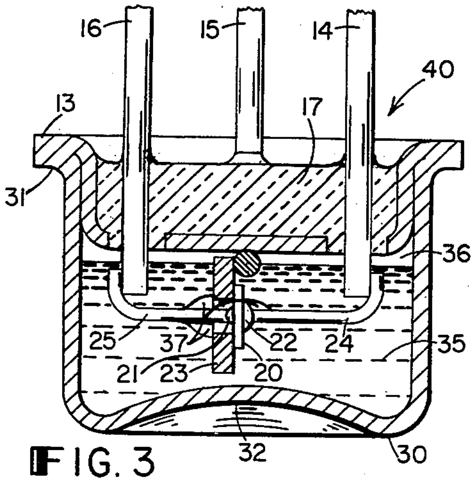
Figure 5:
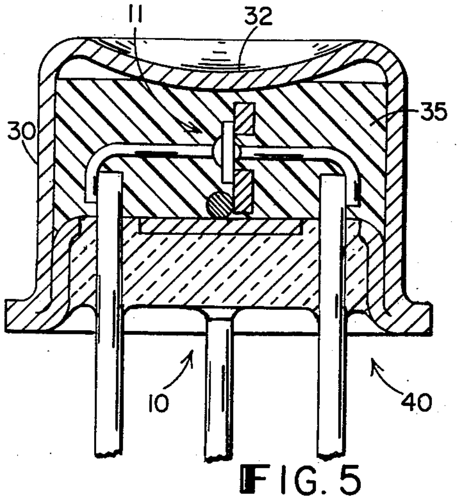
Figure 4:
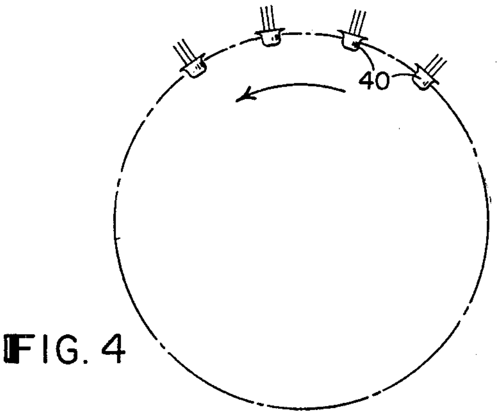

The details of the invention together with additional objects, features, and advantages thereof may best be understood from the following description and the accompanying drawings wherein:

FIG. 1 is a perspective view of the base or stem section of a two-part container or envelope showing the active elements of an alloyed junction semiconductor transistor mounted thereon, FIG. 2 is a perspective view of the cover section or cap of the container, FIG. 3 is an elevational view partially in cros-section of the cover section filled with a quantity of encapsulating material and sealed to the base section, FIG. 4 illustrates the step of centrifuging sealed devices in order properly to position the encapsulating material within the container, and FIG. 5 is an elevational view partially in cross-section of the sealed transistor after centrifuging and solidifying of the encapsulating material.

In FIG. 1 is shown the base section 10 of a cylindrical two-part semiconductor device container of well known type having the active elements 11 of an alloyed junction transistor mounted thereon. The base section or stem includes a metal casing 12 having at its periphery an outwardly turned rim 13 adapted for sealing to the cover section of the container. Three leads 14, 15, and 16 pass through openings in the surface of the casing. The leads are hermetically sealed in position by a layer or filler of glass 17 which forms a hermetic seal with the casing 12. The active elements of the alloyed junction transistor consisting of a slab of semiconductor material 20, an emitter dot 21 (see FIG. 3), and a collector dot 22 are mounted by a base tab 23 to an extension of the base lead 15. Contact wires 24 and 25 connect the collector and emiter dots to the leads 14 and 16, respectively. The base tab, contact wires, and portions of the leads extending through the casing thus serve as the supporting structure and electrical connections for the active elements.

A cup shaped metal cap or cover section 30 of the two-part container is shown in FIG. 2. The cover fits snugly over the cylindrical walls of the base section 10 and has an outwardly turned rim 31 which mates with the rim 13 of the casing of the stem section for sealing thereto. The top of the cover section has an inwardly extending indentation 32 which can best be seen in FIG. 3.

A quantity of a suitable encapsulating or potting material 35 is placed in the cap 30. This material may be any of various substances such as, for example known potting plastics which can be solidified to form a rigid mass supporting the active elements and their supporting structure and electrical conections. The material desirably should be inert and not capable of contaminating the active elements of the device, or the active elements should first be protected by a material inert with respect to the elements, as by a coating of polymerizable silicon resin. Potting compounds and coating resins of various compositions are widely used as encapsulating materials in semiconductor devices for protection against shock, the particular substance depending upon the desires of the individual practitioner.

The base section 10 with the appropriately prepared active elements 11 mounted thereon is joined to the cover section containing the encapsulating material as shown in FIG. 3. This is accomplished by placing the base section on the cover section with the active elements downward and immersed in the encapsulating material. The rims 31 and 13 of the cover and base section contact each other and are welded together to form a hermetic seal about the entire container. The amount of encapsulating material placed in the cover is less than that required to fill completely the chamber formed by the inner surfaces of the walls of the cover and the base sections to insure that no material comes in contact with the rims which might interfere with the obtaining of a secure seal in the welding step. As can be seen from FIG. 3 the space within the chamber which is not occupied by the encapsulating material includes a void 36 adjacent the inner surface of the base section. Other pockets or voids 37 also tend to form adjacent portions of the active elements and their supporting structure and electrical connections.

Next, the sealed device 40 is centrifuged in the manner illustrated in FIG. 4. This operation is performed with a number of the devices appropriately supported in suitable standard centrifuge apparatus. As shown, the devices are moved at high velocity in a circular path with the outside of the base section facing away from the axis of the path. The forces acting on the various portions of the device because of the centripetal acceleration cause the encapsulating material to accumulate in the region of the chamber adjacent the base section. The encapsulating material is forced into a compact, homogeneous mass which completely fills the spaces surrounding the active elements as well as the supporting structure and electrical connections thus contacting every point on their exposed surfaces. The region occupied by the encapsulating material is completely compact and homogeneous throughout, containing no voids or spaces. During the centrifuging operation the voids or pockets are displaced into the region of the chamber adjacent the top of the cover section. The centrifugal force urging the encapsulating material outward from the center of rotation and agglomerating it against the base section of the sealed device causes the encapsulating material to have a flat planar surface presented at the space left adjacent the top of the cover section. This surface lies transverse to the forces which act on the encapsulating material. As can be seen from FIG. 5 the quantity of encapsulating material in the chamber is sufficient so that the indentation or irregularity 32 in the cover section extends into the encapsulating material and correspondingly alters the configuration of the region occupied by the encapsulating material.

After the encapsulating material has been urged into the desired region of the enclosed chamber of the device, the device is oriented in an upright position with the base section downward and the surface of the encapsulating material lying horizontally until the encapsulating material has been solidified. Depending upon the particular encapsulating material employed and the desires of the individual practitioner the material may be allowed to set at room temperature or the process may be accelerated by curing at an elevated temperature.

The resulting encapsulated or potted and sealed device as shown in FIG. 5 contains a dense, compact, homogeneous mass of solid material which totally fills the lowermost region of the chamber and firmly supports all portions of the active elements, their supporting structure, and their electrical connections. The base section 10 and the inner surfaces of the side walls of the cover section 30 determine the shape of the mass 35 and thus confine it, preventing shifting of the mass sideward or downward. The indentation 32 in the cover section extends a portion of the inner surface of the walls of the cover section into the mass at the otherwise planar surface of the mass so as to engage a complementary portion in the mass and thereby serve to hold it positively and rigidly in position against shifting upward toward the region occupied by the voids.

In one embodiment of the invention an envelope of the type described herein was employed for enclosing an alloyed junction transistor. The encapsulating material used was an uncured epoxy resin of viscous consistency. The resin as applied consisted of 92% by weight of an epoxy casting resin sold under the trade name of Stycast No. 2651 by Emerson and Cuming, Inc., of Canton, Massachusetts, and 8% by weight of a curing agent sold under the trade name Catalyst No. 11 also by Emerson and Cuming, Inc. A quantity of the mixture was placed in the cover section which was then united with the base section of the container and welded thereto as shown in FIG. 3. Several similarly sealed devices were then centrifuged with the base section and leads outermost as illustrated in FIG. 4. The centrifuging apparatus was operated at a rotational speed producing a force about 1,000 times the force of gravity. Immediately upon completion of this step the devices were removed from the centrifuging apparatus, oriented with the leads extending downward, and then baked at 75° C. for two hours with the leads remaining downward in order to cure and solidify the epoxy resin in place as shown in FIG. 5. Devices produced according to the foregoing method of the invention have been subjected to mechanical shocks in excess of 20,000 times the force of gravity without causing failure of the devices.

What is claimed is:

An encapsulated transistor comprising a container having a cylindrical base section with leads sealed therethrough and insulated therefrom, the active elements of the transistor being mounted on the base section; electrical connections between the leads and the active elements; a cylindrical cover section having one end closed sealed at its open end to the base section; the inner surfaces of the walls of the sections forming a chamber enclosing the active elements, portions of the leads, and the electrical connections; an indentation in the closed end of the cover section forming a projection of the inner surface of the wall of the closed end of the cover section extending into the chamber and toward the base section; and a mass of rigid encapsulating material only partially occupying said chamber and completely surrounding and in contact with all points on the surfaces of the active elements, the portion of the leads within the chamber, and the electrical connection, the surfaces of said mass intimately contacting portions of the inner surfaces of the walls forming the chamber except at a flat, planar, annular surface of the mass lying generally transverse to the central axis of the cylindrical cover section and encircling a portion of the projection of the inner surface of the wall of the closed end of the cover section.

References Cited by the Examiner

UNITED STATES PATENTS

| | | | |
|---|---|---|---|
| 2,029,430 | 2/36 | Kopinski | 317—260 |
| 2,393,966 | 2/46 | Brennan | 317—23 XR |
| 2,647,224 | 7/53 | Bruck | 317—101 |
| 2,740,075 | 3/56 | Walker et al. | 317—234 |
| 2,813,326 | 11/57 | Liebowitz | 29—25.3 |
| 2,836,878 | 6/58 | Shepard | 29—25.3 |
| 2,850,687 | 9/58 | Hammes | 313—235 |
| 2,879,458 | 3/59 | Schubert | 317—234 |
| 2,888,736 | 6/59 | Sardella | 317—235 XR |
| 2,906,931 | 9/59 | Armstrong | 317—235 |
| 2,929,971 | 3/60 | Van Amstel | 317—235 |
| 2,960,641 | 11/60 | Cohen et al. | 317—235 |
| 2,979,645 | 4/61 | Maiden | 174—52.6 XR |

JAMES D. KALLAM, *Acting Primary Examiner.*

SAMUEL BERNSTEIN, GEORGE N. WESTBY, DAVID J. GALVIN, *Examiners.*